US012609691B2

(12) United States Patent
Hiyama

(10) Patent No.: US 12,609,691 B2
(45) Date of Patent: Apr. 21, 2026

(54) DRIVER DEVICE

(71) Applicant: Mitsubishi Electric Corporation, Tokyo (JP)

(72) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 17 days.

(21) Appl. No.: 18/730,970

(22) PCT Filed: Apr. 21, 2022

(86) PCT No.: PCT/JP2022/018385

§ 371 (c)(1),
(2) Date: Jul. 22, 2024

(87) PCT Pub. No.: WO2023/203710

PCT Pub. Date: Oct. 26, 2023

(65) Prior Publication Data

US 2025/0119134 A1 Apr. 10, 2025

(51) Int. Cl.
*H02M 1/08* (2006.01)
*H03K 17/042* (2006.01)
*H03K 17/284* (2006.01)

(52) U.S. Cl.
CPC ........ *H03K 17/04206* (2013.01); *H02M 1/08* (2013.01); *H03K 17/284* (2013.01)

(58) Field of Classification Search
CPC . H02M 1/08; H03K 17/042; H03K 17/04206; H03K 17/284

(Continued)

(56) References Cited

U.S. PATENT DOCUMENTS 8,477,518 B2 7/2013 Takamatsu et al.
2009/0066402 A1* 3/2009 Hiyama ............... H03K 17/168
327/392

(Continued)

FOREIGN PATENT DOCUMENTS

JP 2004-096830 A 3/2004
JP 4333802 B1 9/2009

(Continued)

OTHER PUBLICATIONS

International Search Report issued in PCT/JP2022/018385; mailed Jun. 14, 2022.

(Continued)

*Primary Examiner* — William Hernandez
(74) *Attorney, Agent, or Firm* — Studebaker Brackett PLLC

(57) ABSTRACT

An object is to provide a technique capable of optimizing the turn-on speed. A driver device includes a gate drive circuit power supply capable of changing an output voltage; a power supply having a fixed voltage lower than the output voltage; a control unit that changes the output voltage of the gate drive circuit power supply on the basis of related information related to a load current of the semiconductor switching element; and a delay circuit that, when the gate drive signal is turned on, performs control to supply the fixed voltage to a gate of the semiconductor switching element for a predetermined period, and then performs control to supply the output voltage to the gate.

3 Claims, 8 Drawing Sheets

(58) Field of Classification Search
USPC ......................................... 327/108, 109, 110
See application file for complete search history.

(56) References Cited

U.S. PATENT DOCUMENTS

2020/0007118 A1*   1/2020   Araragi ................ H03K 17/168
2024/0291402 A1*   8/2024   Kawahara ........... H02M 1/0009

FOREIGN PATENT DOCUMENTS

JP       2010-034935 A     2/2010
JP       2012-186998 A     9/2012

OTHER PUBLICATIONS

"Notice of Reasons for Refusal" Office Action issued in JP 2024-515995; mailed by the Japanese Patent Office on Nov. 19, 2024.

* cited by examiner

F I G. 1

F I G. 4
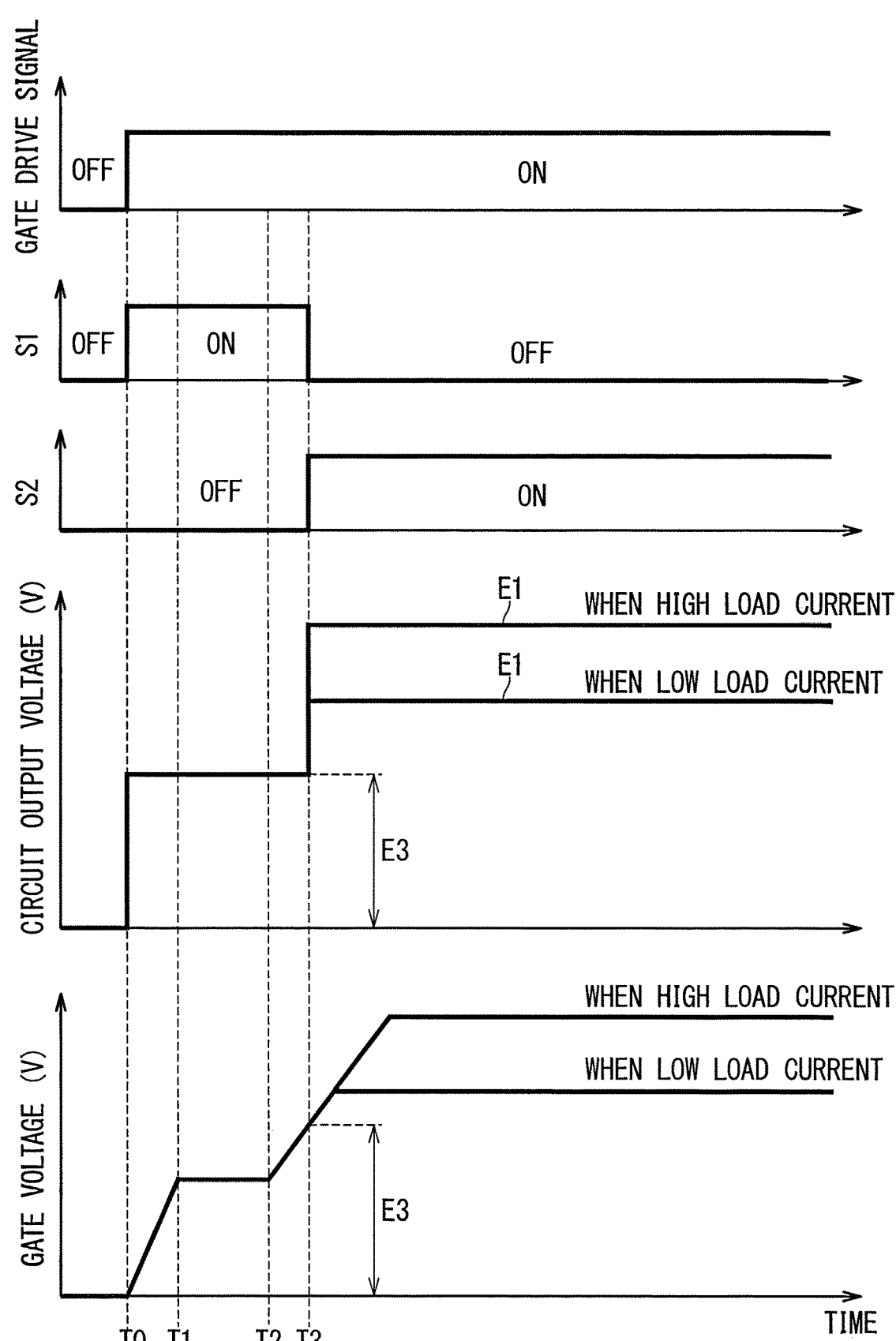

F I G. 7
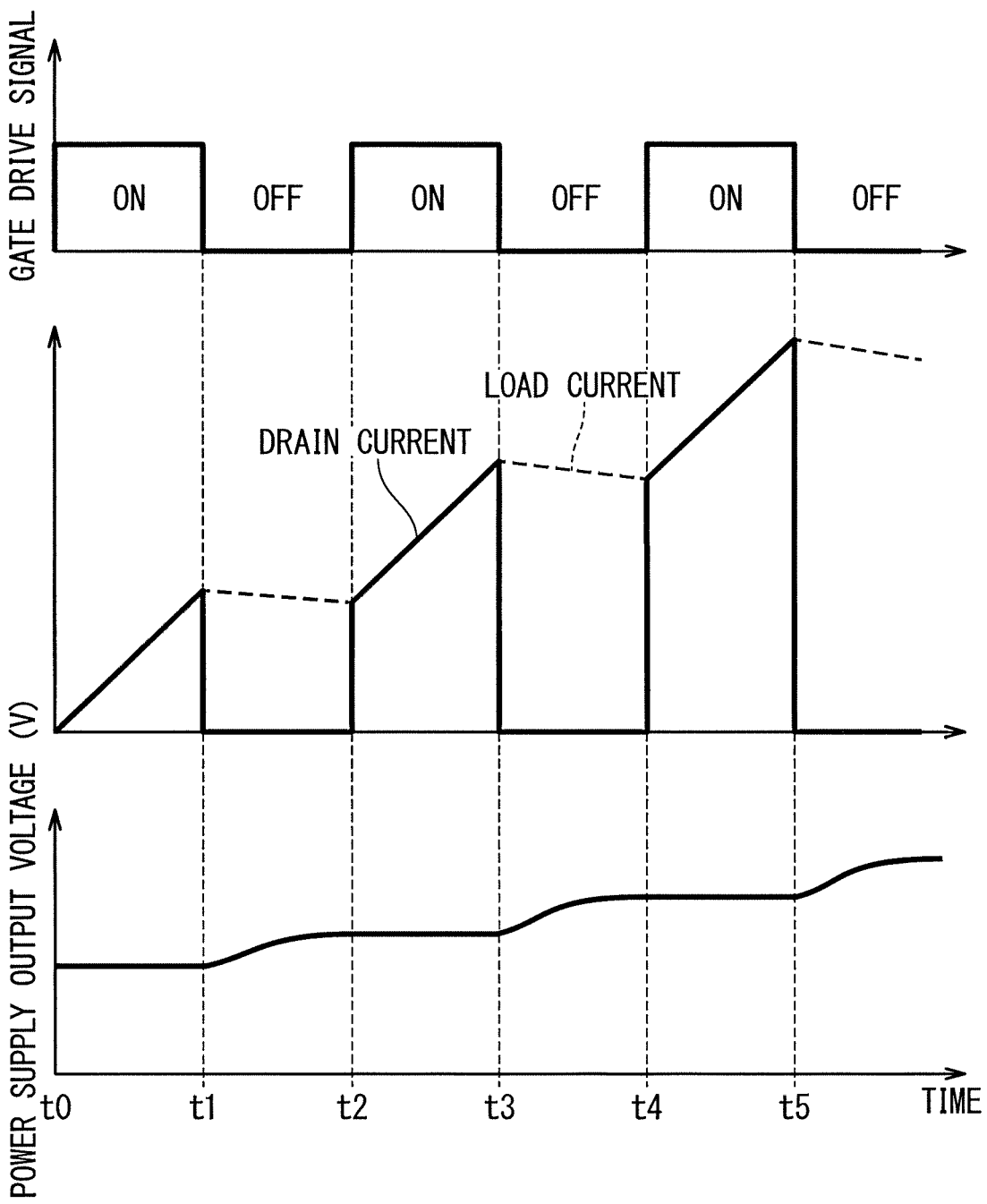

DRIVER DEVICE

TECHNICAL FIELD

The present disclosure relates to a driver device.

BACKGROUND ART

Various techniques have been proposed for a driver device that drives a semiconductor switching element such as a voltage control type semiconductor switching element. For example, Patent Documents 1 and 2 propose a technique for increasing or decreasing the voltage supplied to a gate of a voltage control type semiconductor switching element based on the load current, in order to reduce a steady loss of the voltage control type semiconductor switching element.

PRIOR ART DOCUMENTS

Patent Documents

Patent Document 1: Japanese Patent No. 4333802
Patent Document 2: Japanese Patent Application Laid-Open No. 2004-96830

SUMMARY

Problem to be Solved by the Invention

Generally, when the load current of the semiconductor switching element is zero or low, the turn-on speed of the semiconductor switching element increases. In addition, when the voltage applied to the gate of the semiconductor switching element at the time of turn-on sharply increases, the turn-on speed of the semiconductor switching element increases.

Nevertheless, in the techniques of Patent Documents 1 and 2, since the voltage applied to the gate is simply increased, the voltage applied to the gate may be steeply increased when the AC load current is instantaneously zero or low. In this case, there is a problem that the turn-on speed of the semiconductor switching element becomes excessive, and the surge voltage and the radiation noise become large.

Therefore, the present disclosure has been made in view of the above problems, and an object thereof is to provide a technique capable of optimizing the turn-on speed.

Means to Solve the Problem

A driver device according to the present disclosure is a driver device that drives a semiconductor switching element based on on and off of a gate drive signal. The driver device includes: a gate drive circuit power supply capable of changing an output voltage; a power supply having a fixed voltage lower than the output voltage; a control unit that changes the output voltage of the gate drive circuit power supply, based on related information related to a load current of the semiconductor switching element; and a delay circuit that performs control to supply the fixed voltage to a gate of the semiconductor switching element for a predetermined period and then performs control to supply the output voltage to the gate when the gate drive signal is turned on.

Effects of the Invention

According to the present disclosure, when a gate drive signal is turned on, control is performed to supply a fixed voltage to a gate of a semiconductor switching element for a predetermined period, and then control is performed to supply an output voltage to the gate. According to such a configuration, the turn-on speed can be optimized.

Objects, features, aspects, and advantages of the present disclosure will become more apparent from the following detailed description and the accompanying drawings.

BRIEF DESCRIPTION OF DRAWINGS

FIG. 1 is a circuit diagram illustrating a configuration of a driver device according to a first embodiment.

FIG. 4 is a diagram illustrating an operation of the driver device according to the first embodiment.

FIG. 7 is a diagram illustrating an operation of the driver device according to the second embodiment.

DESCRIPTION OF EMBODIMENTS

First Embodiment

Figure 1:
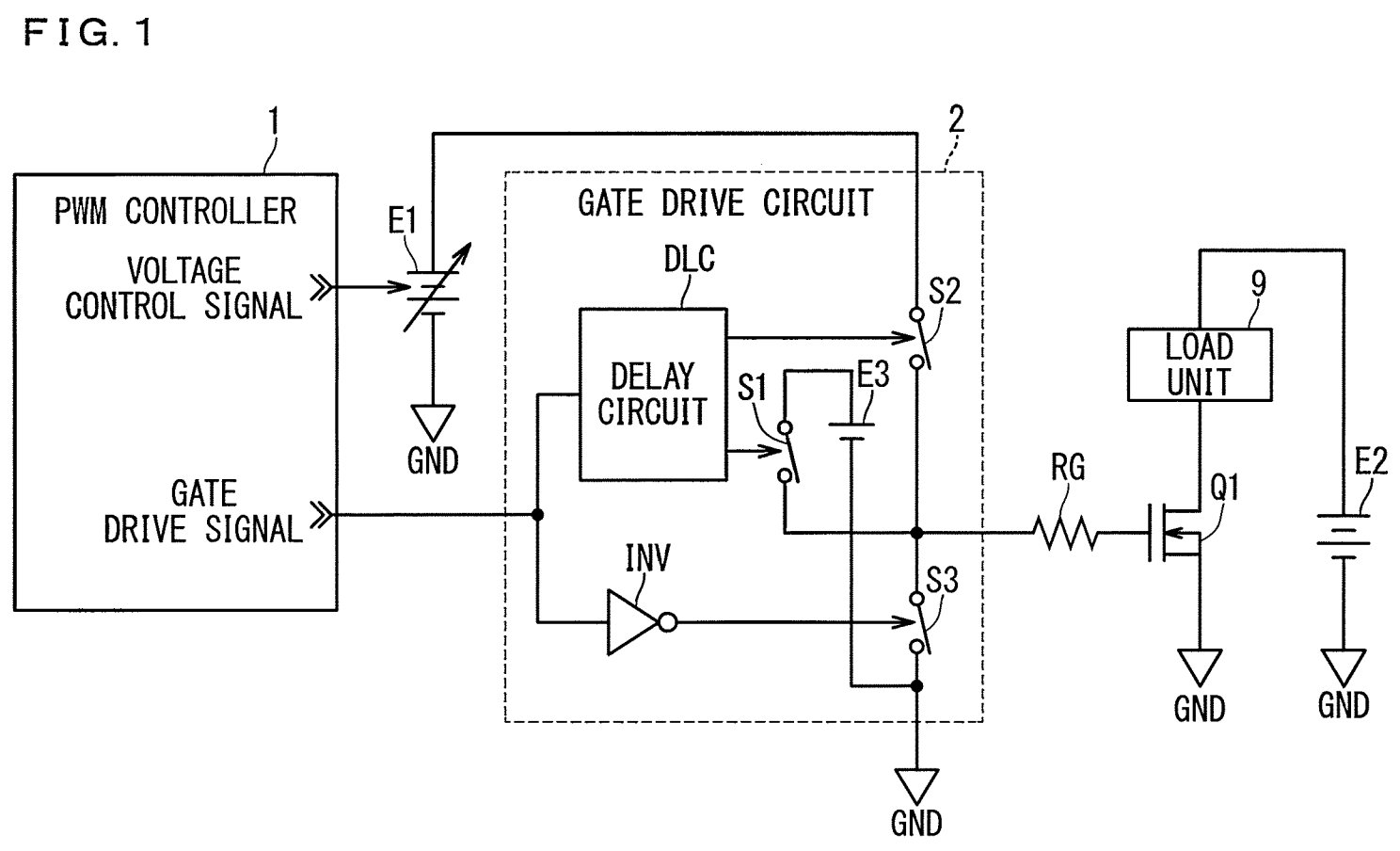

FIG. 1 is a circuit diagram illustrating a configuration of a driver device according to a first embodiment. The driver device of FIG. 1 includes a gate drive circuit power supply E1, a PWM controller 1 that is a control unit, a gate drive circuit 2, and a resistor RG.

The driver device of FIG. 1 is connected to a gate of a semiconductor switching element Q1 that is a voltage control type semiconductor switching element. The driver device of FIG. 1 drives the semiconductor switching element Q1 based on on and off of the gate drive signal.

Figure 2:
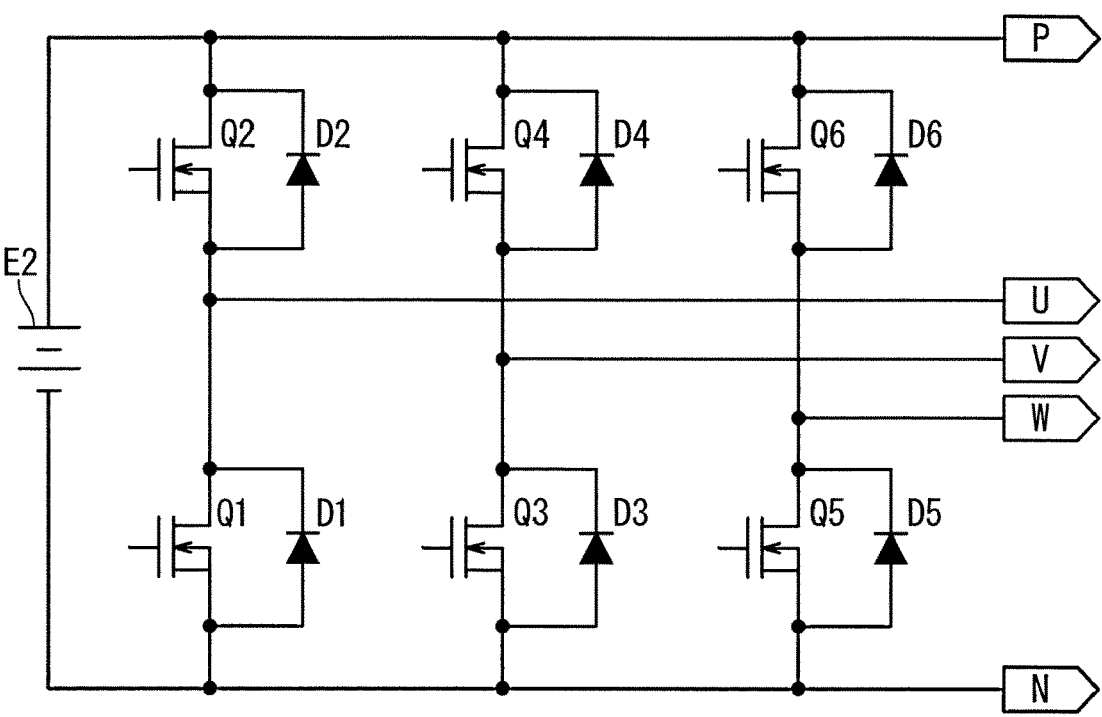
FIG. 2 is a circuit diagram illustrating a configuration of the driver device according to the first embodiment.

The semiconductor switching element Q1 according to the first embodiment is used in an inverter circuit as illustrated in FIG. 2, and constitutes the inverter circuit. In the inverter circuit of FIG. 2, flywheel diodes D1 to D6 are connected in parallel to the semiconductor switching elements Q1 to Q6, respectively. Then, the semiconductor switching elements Q2, Q4, and Q6 as the upper arms and the semiconductor switching elements Q1, Q3, and Q5 as the lower arms are connected in series, respectively, and the three sets of upper and lower arms and a power supply E2 are connected in parallel. In FIG. 1, illustration of FIG. 2 is omitted for convenience, and the semiconductor switching element Q1 is connected to the power supply E2 via a load unit 9.

Hereinafter, the semiconductor switching element Q1 will be described as a metal oxide semiconductor field effect transistor (MOSFET), but is not limited to the MOSFET as described later.

Next, components of the driver device according to the first embodiment will be described in detail.

The gate drive circuit power supply E1 is configured to be able to change an output voltage that is a voltage output from the gate drive circuit power supply E1. Hereinafter, the output voltage of the gate drive circuit power supply E1 may be referred to as a power supply output voltage.

The PWM controller 1 outputs a rectangular wave-shaped gate drive signal to the gate drive circuit 2. The PWM controller 1 controls the load current of the semiconductor switching element Q1 by varying the duty ratio, which is the ratio of the on-time and the off-time of the gate drive signal, and controlling the output of the gate drive circuit 2. The load current of the semiconductor switching element Q1 is, for example, a current flowing through the source-drain of the semiconductor switching element Q1 connected to the load unit 9 or the like.

The PWM controller 1 also outputs a voltage control signal to the gate drive circuit power supply E1. The PWM controller 1 performs control to change the power supply output voltage of the gate drive circuit power supply E1 by changing the voltage control signal, based on the related information related to the load current of the semiconductor switching element Q1. In the first embodiment, the related information related to the load current is a change pattern of the power supply output voltage determined in advance with respect to the effective value of the load current, and this change pattern is stored in advance in the PWM controller 1.

Figure 3:
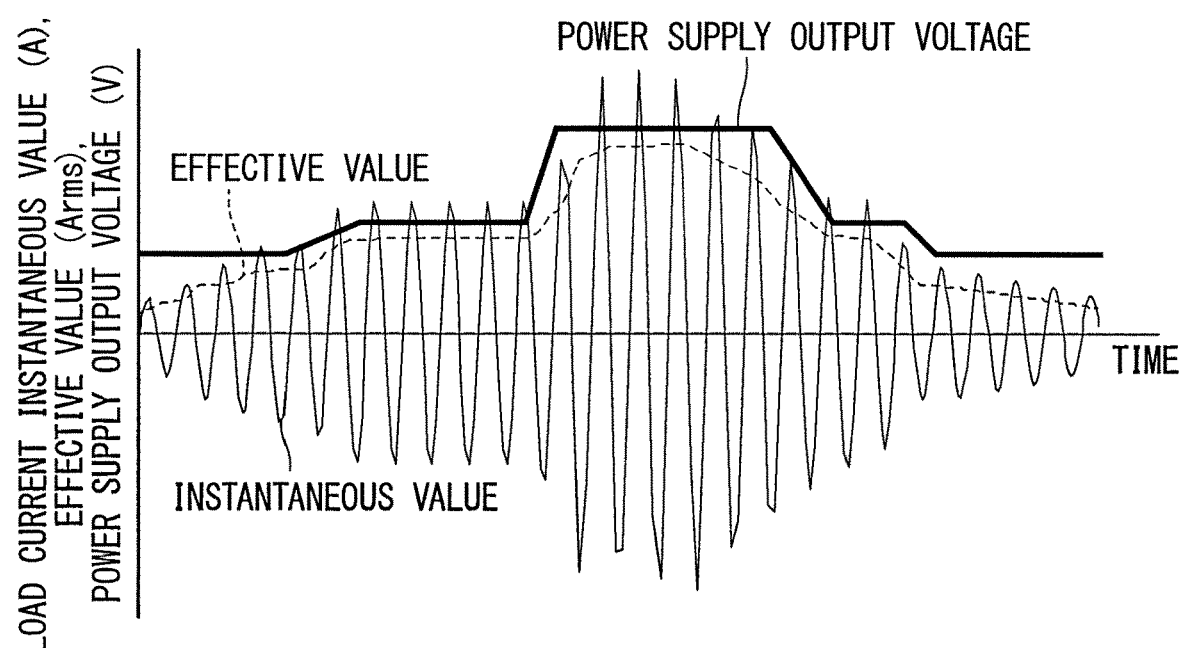
FIG. 3 is a diagram illustrating a change pattern of a power supply output voltage according to the first embodiment.

FIG. 3 is a diagram illustrating an example of a change pattern of the power supply output voltage. A thin solid line indicates an instantaneous value of the load current, a thin dotted line indicates an effective value of the load current, and a thick solid line indicates a change pattern of the power supply output voltage. The instantaneous value of the load current corresponds to the waveform of the gate drive signal, and changes according to on and off of the gate drive signal. An alternating current indicated by an instantaneous value of the load current flows through a load connected to the output (U, V, W) of FIG. 2.

The PWM controller 1 controls the power supply output voltage of the gate drive circuit power supply E1 so as to increase the power supply output voltage of the gate drive circuit power supply E1 when the effective value of the load current is large and to decrease the power supply output voltage of the gate drive circuit power supply E1 when the effective value of the load current is small. The PWM controller 1 may increase or decrease the power supply output voltage of the gate drive circuit power supply E1 stepwise as illustrated in FIG. 3, or may be proportional to the effective value of the load current. For example, the PWM controller 1 may change the power supply output voltage of the gate drive circuit power supply E1 based on the number of times of turning on and off the gate drive signal and a predetermined change pattern.

The resistor RG in FIG. 1 is connected between the gate of the semiconductor switching element Q1 and the gate drive circuit 2.

The gate drive circuit 2 of FIG. 1 includes a power supply E3, a first switch S1, a second switch S2, a third switch S3, an inverter circuit INV that is a NOT circuit, and a delay circuit DLC.

The power supply E3 has a fixed voltage lower than the power supply output voltage of the gate drive circuit power supply E1.

One end of the first switch S1 is connected to the power supply E3, the other end of the first switch S1 is connected to the resistor RG, and on and off of the first switch S1 is controlled by the delay circuit DLC.

One end of the second switch S2 is connected to the gate drive circuit power supply E1, the other end of the second switch S2 is connected to the resistor RG, and on and off of the second switch S2 is controlled by the delay circuit DLC.

One end of the third switch S3 is connected to the reference voltage GND, the other end of the third switch S3 is connected to the resistor RG, and on and off of the third switch S3 is controlled by a gate drive signal inverted by the inverter circuit INV.

When the gate drive signal is turned on, the delay circuit DLC performs control to turn on the first switch S1 and turn off the second switch S2 so that the fixed voltage of the power supply E3 is supplied to the gate of the semiconductor switching element Q1 for a predetermined period. After the fixed voltage of the power supply E3 is supplied to the gate for a predetermined period, the delay circuit DLC performs control to turn off the first switch S1 and turn on the second switch S2 so that the power output voltage of the gate drive circuit power supply E1 is supplied to the gate of the semiconductor switching element Q1.

The delay circuit DLC performs control to turn off the first switch S1 and turn off the second switch S2 when the gate drive signal is turned off. In this case, the third switch S3 is turned on by the gate drive signal inverted by the inverter circuit INV, and the reference voltage GND is supplied to the gate of the semiconductor switching element Q1. That is, in the first embodiment, the first switch S1, the second switch S2, and the third switch S3 are exclusively turned on.

Operation

FIG. 4 is a diagram illustrating an operation of the driver device according to the first embodiment. Hereinafter, in order to distinguish from the power supply output voltage of the gate drive circuit power supply E1, the output voltage of the gate drive circuit 2 may be referred to as a circuit output voltage. FIG. 4 illustrates a gate drive signal, on and off of the first switch S1, on and off of the second switch S2, a circuit output voltage, and a gate voltage of the semiconductor switching element Q1.

When the gate drive signal is turned from off to on at a time point TO, the first switch S1 is turned on. As a result, the circuit output voltage becomes the voltage of the power supply E3, and the gate voltage increases. A period from a time point T1 to a time point T2 is a Miller period, and in the Miller period, the gate voltage becomes constant at a voltage smaller than the voltage of the power supply E3. When the Miller period ends at the time point T2, the gate voltage rises so as to approach the fixed voltage of the power supply E3.

At a time point T3, the gate voltage becomes about a fixed voltage of the power supply E3. In the example of FIG. 4, at that timing, the first switch S1 is turned off and the second switch S2 is turned on by the control of the delay circuit DLC. As a result, the circuit output voltage becomes the power supply output voltage of the gate drive circuit power supply E1, and the gate voltage increases even after the time point T3.

In the example of FIG. 4, the timing at which the first switches S1 and S2 are switched is the same as the timing at which the gate voltage becomes about the fixed voltage of the power supply E3, but the present invention is not limited thereto. For example, the timing at which the first switches S1 and S2 are switched may be before or after the timing at which the gate voltage becomes about the fixed voltage of the power supply E3, or may be during the Miller period.

After the time point T3 in FIG. 4, as described above, the power supply output voltage becomes low when the load current is low, and the power supply output voltage becomes high when the load current is high, and this is reflected in the circuit output voltage and the gate voltage.

Although not illustrated, when the gate drive signal is turned from on to off, the first switch S1 and the second switch S2 are turned off, and the third switch S3 is turned on. As a result, the circuit output voltage becomes the reference voltage GND, the gate voltage drops, and the semiconductor switching element Q1 is turned off.

Summary of First Embodiment

According to the driver device of the first embodiment, the PWM controller 1 changes the power supply output voltage of the gate drive circuit power supply E1 on the basis of the related information related to the load current of the semiconductor switching element Q1. As a result, as illustrated in FIGS. 3 and 4, since the gate voltage applied to the semiconductor switching element Q1 increases when the load current increases, the voltage of the semiconductor switching element Q1 when it is turned on can be reduced, and the steady loss of the semiconductor switching element Q1 can be reduced. In addition, the ratio of the time under the condition that the load current is maximum to the entire operation time becomes low, and the average voltage applied to the gate of the semiconductor switching element Q1 and the gate drive circuit 2 becomes lower than the maximum voltage of the power supply output voltage of the gate drive circuit power supply E1. Therefore, it can be expected to reduce failures of the gate of the semiconductor switching element Q1 and the gate drive circuit 2.

Here, in general, when the load current of the semiconductor switching element is zero or low, the turn-on speed of the semiconductor switching element increases. In addition, when the voltage applied to the gate of the semiconductor switching element at the time of turn-on sharply increases, the turn-on speed of the semiconductor switching element increases. Therefore, when the gate voltage is simply increased in accordance with an increase in the effective value of the load current in order to reduce the steady loss of the semiconductor switching element Q1, the voltage applied to the gate may be sharply increased when the instantaneous value of the AC load current is zero or low. In this case, there is a problem that the turn-on speed of the semiconductor switching element Q1 becomes excessive, and the surge voltage and the radiation noise become large.

On the other hand, in the first embodiment, the gate voltage initially applied when the semiconductor switching element Q1 is turned on is fixed to the fixed voltage of the power supply E3. Therefore, an increase in the gate voltage of the semiconductor switching element becomes gentle. As a result, an increase in the turn-on speed due to an increase in the power supply output voltage of the gate drive circuit power supply E1 can be suppressed, so that an increase in the surge voltage and the radiation noise can be suppressed.

In the first embodiment, the PWM controller 1 changes the power supply output voltage of the gate drive circuit power supply E1 based on a predetermined change pattern. Therefore, even if the waveform of the load current is a sine wave or the like, the power supply output voltage of the gate drive circuit power supply E1 can be appropriately changed. Note that even if the waveform of the load current is a sine wave or the like, there are cases where it is not necessary to appropriately change the power supply output voltage of the gate drive circuit power supply E1, and where the execution value of the load current of the semiconductor switching element Q1 is detected. In such a case, the PWM controller 1 may measure the execution value of the load current of the semiconductor switching element Q1, and change the power supply output voltage of the gate drive circuit power supply E1 based on the execution value rather than based on a predetermined change pattern.

Modification

The semiconductor switching element Q1 may be, for example, an insulated gate bipolar transistor (IGBT), a reverse conducting-IGBT (RC-IGBT), or the like. The material of the semiconductor switching element Q1 may be normal silicon (Si), or may be a wide band gap semiconductor such as silicon carbide (SiC), gallium nitride (GaN), or diamond. When the material of the semiconductor switching element Q1 is a wide band gap semiconductor, stable operation under high temperature and high voltage, and high switching speed can be achieved.

Figure 5:
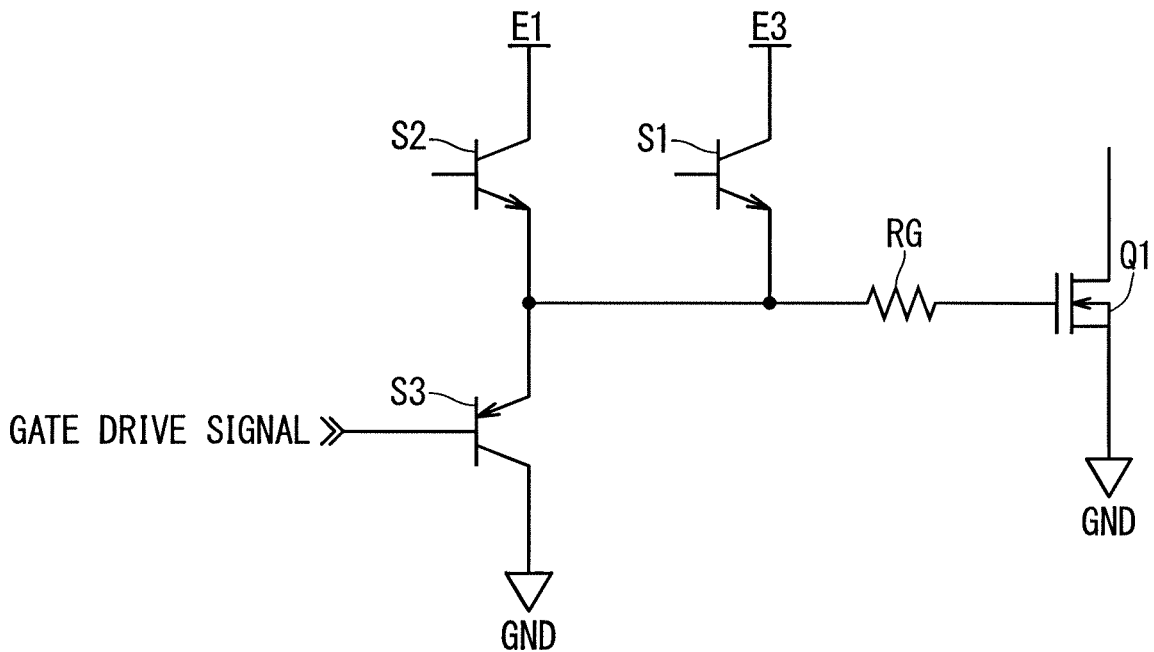
FIG. 5 is a circuit diagram illustrating a configuration of a driver device according to a modification.

Although the gate drive circuit 2 of FIG. 1 includes the inverter circuit INV, the gate drive circuit 2 may not include the inverter circuit INV. For example, in a case where the first switch S1, the second switch S2, and the third switch S3 are constituted of an NPN transistor, an NPN transistor, and a PNP transistor, respectively, as in a complementary transistor of FIG. 5, the inverter circuit INV is unnecessary. Moreover, the configuration of gate drive circuit 2 is not limited to the configuration in FIG. 1 as long as the circuit output voltage in Fig.4 can be obtained.

Note that the present modification may be appropriately applied to second and subsequent embodiments described below.

Second Embodiment

Figure 6:
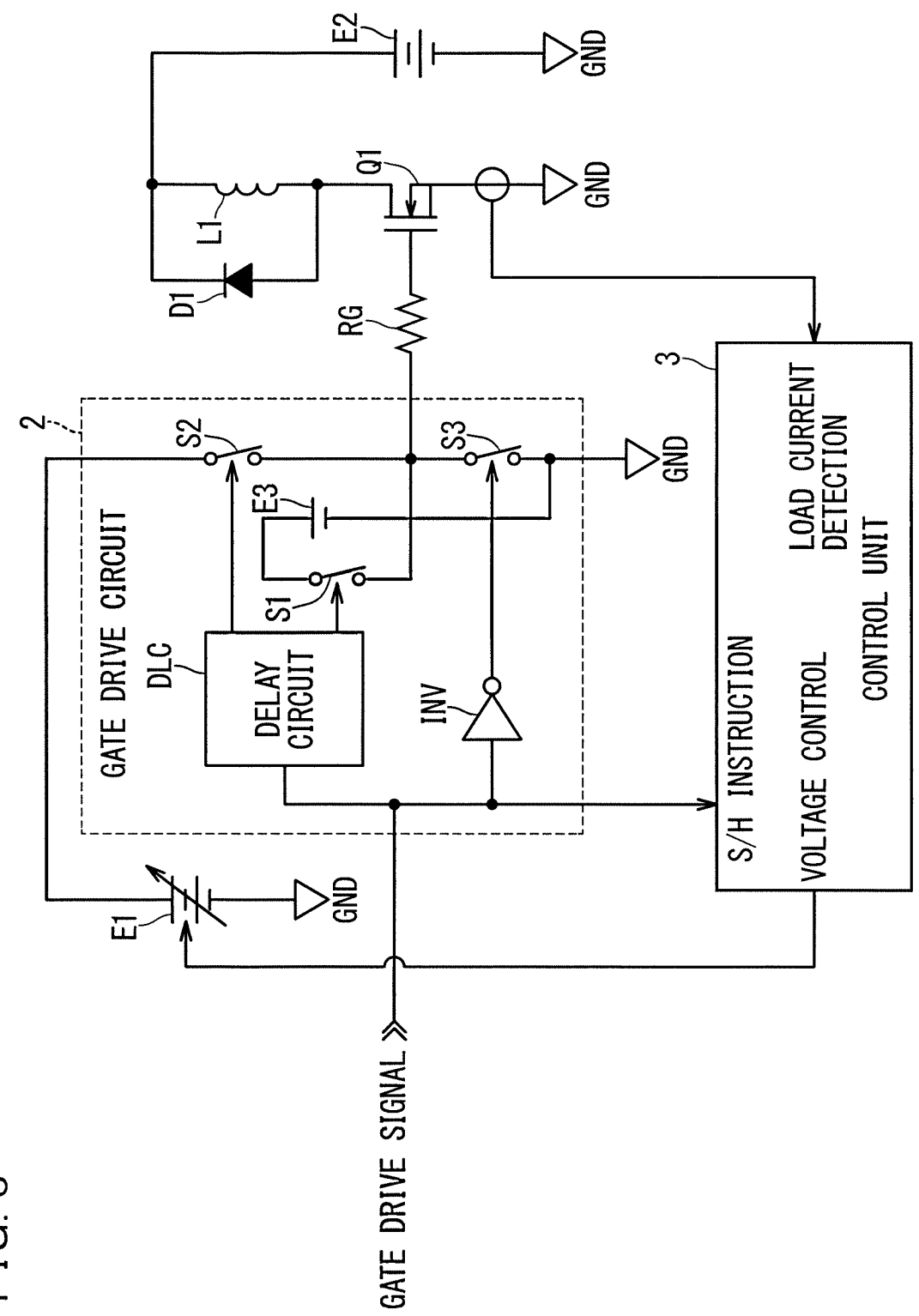
FIG. 6 is a circuit diagram illustrating a configuration of a driver device according to a second embodiment.

FIG. 6 is a cross-sectional view illustrating a configuration of a driver device according to a second embodiment. Hereinafter, among the components according to the second embodiment, the same or similar components as or to the above-described components will be denoted by the same or similar reference numerals, and different components will be mainly described.

The configuration of the driver device of FIG. 6 is similar to the configuration of the driver device of FIG. 1 in which the PWM controller 1 is replaced with a control unit 3 and the load unit 9 is replaced with an inductive load L1 and a flywheel diode D1. The drain of the semiconductor switching element Q1 is connected to the power supply E2 via the inductive load L1 and the flywheel diode D1 connected in parallel.

A gate drive signal used as a sampling and holding (S/H) instruction and a load current detection signal indicating a sampled load current of the semiconductor switching element Q1 are input to the control unit 3 of FIG. 6. The control unit 3 changes the power supply output voltage of the gate drive circuit power supply E1, based on the load current of the semiconductor switching element Q1 sampled when the gate drive signal is turned off.

In other words, the control unit 3 performs control to change the power supply output voltage of the gate drive circuit power supply E1 by changing the voltage control signal, based on the related information related to the load current of the semiconductor switching element Q1. The related information mentioned here is a load current sampled when the gate drive signal is turned off.

The other configurations of the second embodiment are similar to those of the first embodiment. For example, when the gate drive signal is turned on, the delay circuit DLC performs control to supply a fixed voltage of the power supply E3 to the gate of the semiconductor switching element Q1 for a predetermined period, and then performs control to supply a power supply output voltage of the gate drive circuit power supply E1 to the gate.

Operation

FIG. 7 is a diagram illustrating the operation of the control unit 3 that changes the power supply output voltage of the gate drive circuit power supply E1 among the operations of the driver device according to the second embodiment. In the operation of the driver device according to the second embodiment, the operation related to the circuit output voltage of the gate drive circuit 2 is similar to the operation related to the circuit output voltage described with reference to FIG. 4 in the first embodiment. Hereinafter, the operation of the control unit 3 that changes the power supply output voltage of the gate drive circuit power supply E1 will be mainly described.

When the semiconductor switching element Q1 is turned off, a load current flows back to the flywheel diode D1 as indicated by a broken line in FIG. 7 due to the inductive load L1 in FIG. 6.

The control unit 3 samples the load current of the semiconductor switching element Q1 at timings t1, t3, t5, . . . at which the semiconductor switching element Q1 is turned off. Then, the control unit 3 changes the power supply output voltage of the gate drive circuit power supply E1 based on the sampled load current in the off-periods t1 to t2, t3 to t4, . . . of the semiconductor switching element Q1, and then maintains the power supply output voltage until the next timings t3, t5, . . . . For example, the control unit 3 increases the power supply output voltage when the sampled load current is larger than the previous sampling, and decreases the power supply output voltage when the sampled load current is smaller than the previous sampling. The control unit 3 may increase or decrease the power supply output voltage of the gate drive circuit power supply E1 stepwise, or may be proportional to the effective value of the load current.

Summary of Second Embodiment

According to the driver device of the second embodiment, the control unit 3 changes the power supply output voltage of the gate drive circuit power supply E1 based on the related information related to the load current of the semiconductor switching element Q1. As a result, similarly to the first embodiment, the steady loss of the semiconductor switching element Q1 can be reduced, and the failure of the gate of the semiconductor switching element Q1 and the gate drive circuit 2 can be reduced. In the second embodiment, similarly to the first embodiment, the gate voltage initially applied when the semiconductor switching element Q1 is turned on is fixed to the fixed voltage of the power supply E3, so that an increase in the surge voltage and the radiation noise can be suppressed similarly to the first embodiment.

Here, for example, in the conventional technique such as Patent Document 2, since the power supply output voltage of the gate drive circuit power supply E1 is changed while the semiconductor switching element Q1 is on, it is necessary to shorten the change so that the influence during the change does not reach the semiconductor switching element Q1.

On the other hand, in the second embodiment, the control unit 3 changes the power supply output voltage of the gate drive circuit power supply E1, based on the load current of the semiconductor switching element Q1 sampled when the gate drive signal is turned off. According to such a configuration, since the power supply output voltage of the gate drive circuit power supply E1 can be changed during the period in which the semiconductor switching element Q1 is off, it is possible to suppress the influence of the change in the power supply output voltage from affecting the semiconductor switching element Q1. Moreover, the change in the instantaneous value of the load current can be reflected in the change in the power supply output voltage of the gate drive circuit power supply E1 to some extent.

Third Embodiment

Figure 8:
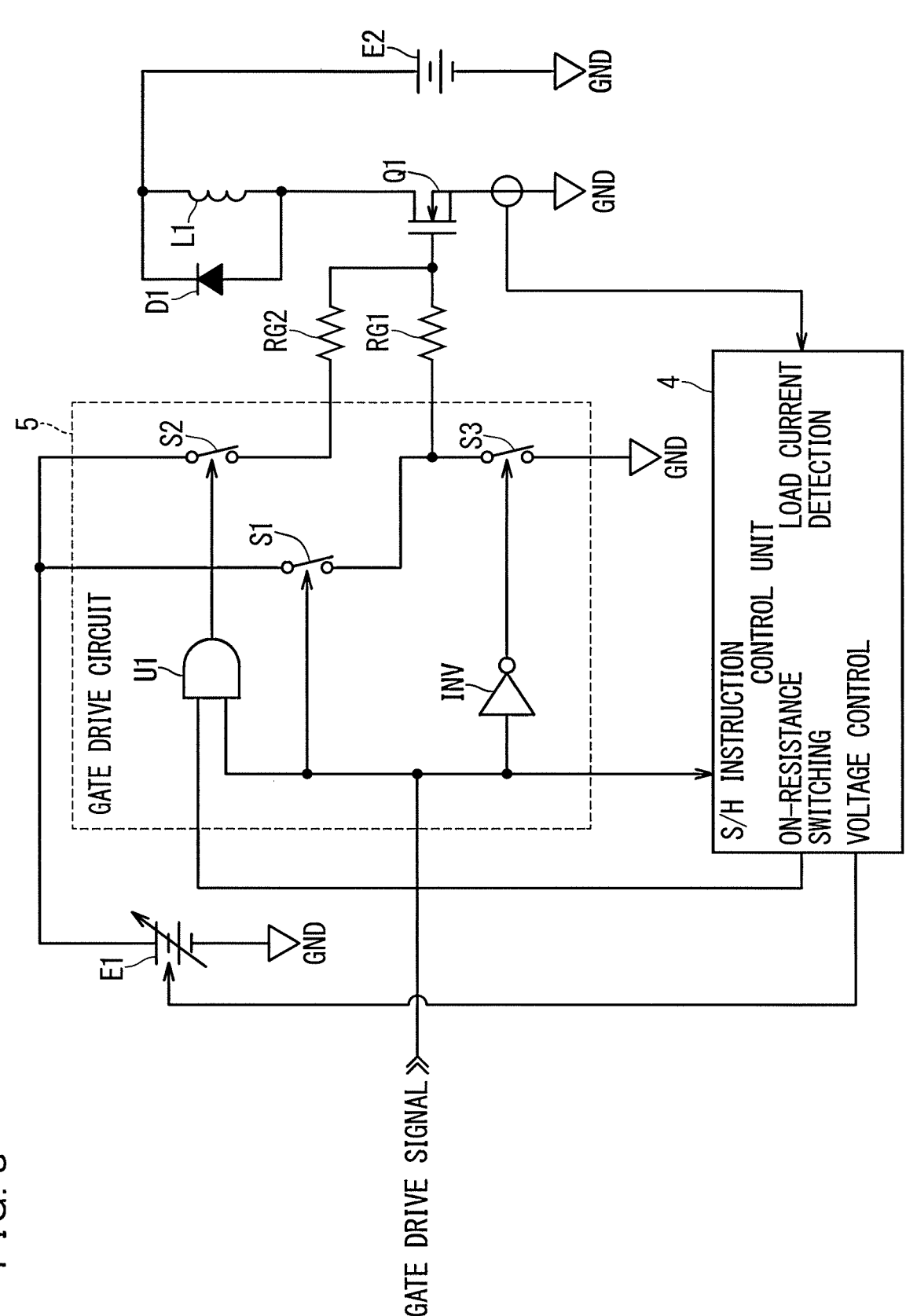
FIG. 8 is a circuit diagram illustrating a configuration of a driver device according to a third embodiment.

FIG. 8 is a circuit diagram illustrating a configuration of a driver device according to a third embodiment. Hereinafter, among the components according to the third embodiment, the same or similar components as or to the above-described components will be denoted by the same or similar reference numerals, and different components will be mainly described.

The driver device of FIG. 8 includes a gate drive circuit power supply E1, a control unit 4, a gate drive circuit 5, a first resistor RG1, and a second resistor RG2.

The driver device of FIG. 8 is connected to the gate of the semiconductor switching element Q1, and drives the semiconductor switching element Q1 based on on and off of a gate drive signal. The drain of the semiconductor switching element Q1 is connected to the power supply E2 via the inductive load L1 and the flywheel diode D1 connected in parallel.

Next, components of the driver device according to the third embodiment will be described in detail.

The gate drive circuit power supply E1 is configured to be able to change a power supply output voltage that is a voltage output from the gate drive circuit power supply E1.

Similarly to the control unit 3 according to the second embodiment, the control unit 4 changes the power supply output voltage of the gate drive circuit power supply E1, based on the load current of the semiconductor switching element Q1 sampled when the gate drive signal is turned off. The control unit 4 of FIG. 8 can output the on-resistance switching signal to an AND circuit U1 of the gate drive circuit 5 described later.

The first resistor RG1 and the second resistor RG2 are connected between the gate of the semiconductor switching element Q1 and the gate drive circuit 5.

The gate drive circuit 5 of FIG. 8 includes a first switch S1, a second switch S2, a third switch S3, an inverter circuit INV that is a NOT circuit, and an AND circuit U1.

One end of the first switch S1 is connected to the gate drive circuit power supply E1, the other end of the first switch S1 is connected to the first resistor RG1, and on and off of the first switch S1 is controlled by a gate drive signal. As a result, the first resistor RG1 can be connected between the gate drive circuit power supply E1 and the gate of the semiconductor switching element Q1.

One end of the second switch S2 is connected to the gate drive circuit power supply E1, the other end of the second switch S2 is connected to the second resistor RG2, and on and off of the second switch S2 is controlled by an output signal of the AND circuit U1. As a result, the second resistor RG2 can be connected in parallel with the first resistor RG1 between the gate drive circuit power supply E1 and the gate of the semiconductor switching element Q1.

One end of the third switch S3 is connected to the reference voltage GND, the other end of the third switch S3 is connected to the resistor RG1, and on and off of the third switch S3 is controlled by a gate drive signal inverted by the inverter circuit INV.

The AND circuit U1 performs an AND operation based on the on-resistance switching signal from the control unit 4 and the gate drive signal, and outputs the result as an output signal of the AND circuit U1. That is, the AND circuit U1 outputs on only when the on-resistance switching signal is on and the gate drive signal is on.

Hereinafter, a resistor connected to the gate of the semiconductor switching element Q1 at the time of turn-on is referred to as a turn-on gate resistor. The control unit 4 according to the third embodiment selectively performs high resistance control with high turn-on gate resistance and low resistance control with low turn-on gate resistance based on the load current. This operation of the control unit 4 will be described in detail later.

Operation

In the operation of the driver device according to the third embodiment, the operation of changing the power supply output voltage of the gate drive circuit power supply E1 is similar to the operation described with reference to FIG. 7 in the second embodiment.

Figure 9:
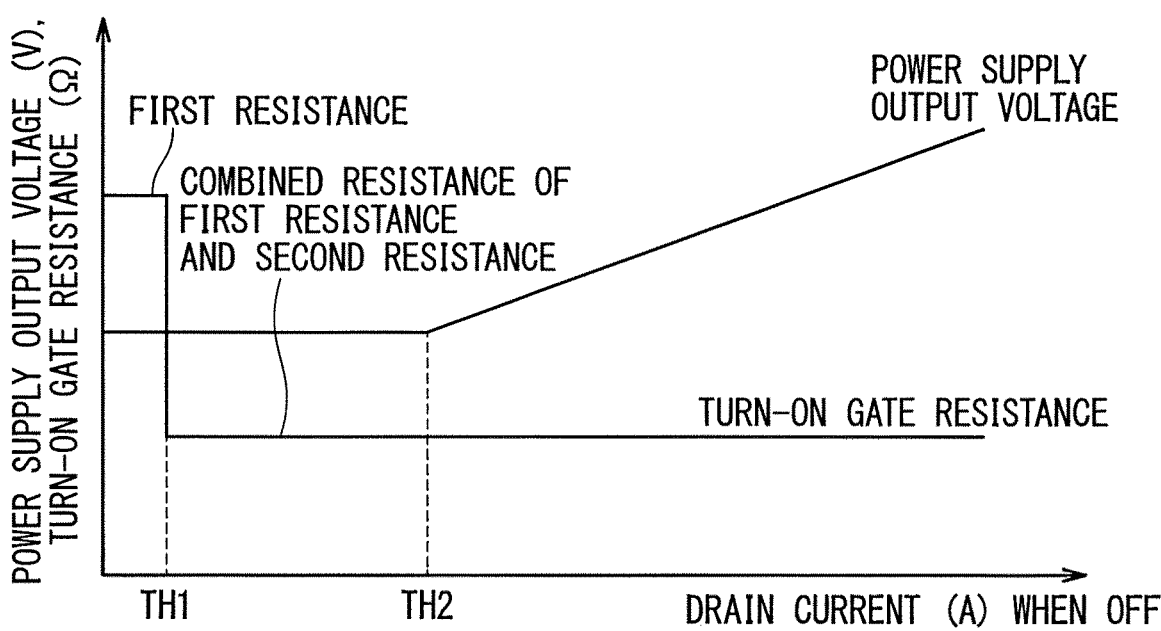
FIG. 9 is a diagram illustrating an operation of the driver device according to the third embodiment.

In the third preferred embodiment, when the load current of the semiconductor switching element Q1 sampled when the gate drive signal is on is equal to or less than a threshold value TH1 in FIG. 9, the control unit 4 outputs an on-resistance switching signal indicating off. When the on-resistance switching signal indicating off is output and the gate drive signal is on, the first switch S1 is turned on, and the second switch S2 and the third switch S3 are turned off. Therefore, the power supply output voltage of the gate drive circuit power supply E1 is supplied to the gate of the semiconductor switching element Q1 via the first resistor RG1. Therefore, as illustrated in FIG. 9, the turn-on gate resistor when the load current is equal to or less than the threshold value TH1 is the first resistor RG1.

On the other hand, when the load current of the semiconductor switching element Q1 sampled when the gate drive signal is on exceeds the threshold value TH1 in FIG. 9, the control unit 4 outputs an on-resistance switching signal indicating on. When the on-resistance switching signal indicating on is output and the gate drive signal is on, the first switch S1 and the second switch S2 are turned on, and the third switch S3 is turned off. Therefore, the power supply output voltage of the gate drive circuit power supply E1 is supplied to the gate of the semiconductor switching element Q1 via the first resistor RG1 and the second resistor RG2. Therefore, as shown in FIG. 9, the turn-on gate resistance when the load current exceeds the threshold value TH1 is a parallel combined resistance (RG1×RG2/(RG1+RG2)) of the first resistance RG1 and the second resistance RG2, As described above, when the load current of the semiconductor switching element Q1 sampled when the gate drive signal is on is equal to or less than the threshold value TH1, the high resistance control in which the turn-on gate resistance becomes the first resistance RG1 is performed. On the other hand, when the load current of the semiconductor switching element Q1 sampled when the gate drive signal is on exceeds the threshold value TH1, low resistance control is performed in which the turn-on gate resistor is a parallel combined resistor of the first resistor RG1 and the second resistor RG2.

When the load current of the semiconductor switching element Q1 sampled when the gate drive signal is on is equal to or less than a threshold value TH2 larger than the threshold value TH1 in FIG. 9, the control unit 4 keeps the power supply output voltage of the gate drive circuit power supply E1 constant. On the other hand, when the load current of the semiconductor switching element Q1 sampled when the gate drive signal is on exceeds the threshold value TH2 in FIG. 9, the control unit 4 increases the power supply output voltage of the gate drive circuit power supply E1 as the load current increases.

Figure 10:
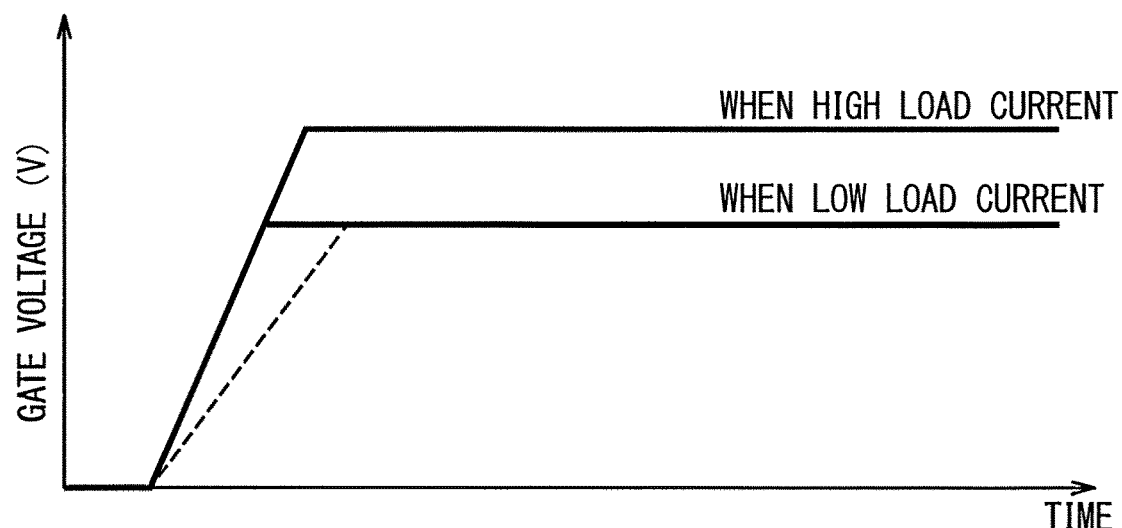
FIG. 10 is a diagram illustrating an operation of the driver device according to the third embodiment.

FIG. 10 is a diagram illustrating the operation of the driver device according to the third embodiment, and specifically, a diagram illustrating the transition of the gate voltage of the semiconductor switching element Q1 by the operation of the driver device. The dotted line indicates the circuit output voltage of the gate drive circuit 2 during the high resistance control in which the turn-on gate resistance increases, and the solid line indicates the circuit output voltage of the gate drive circuit 2 during the low resistance control in which the turn-on gate resistance decreases. When the load current of the semiconductor switching element Q1 is small, the high resistance control is performed, the increase in the gate voltage of the semiconductor switching element becomes gentle, and the switching speed decreases. On the other hand, when the load current of the semiconductor switching element Q1 is large, the low resistance control is performed, and the switching speed increases.

Summary of Third Embodiment

According to the driver device of the third embodiment, the control unit 4 changes the power supply output voltage of the gate drive circuit power supply E1, based on the load current of the semiconductor switching element Q1 sampled when the gate drive signal is turned off. As a result, similarly to the first and second embodiments, the steady loss of the semiconductor switching element Q1 can be reduced, and failure of the gate of the semiconductor switching element Q1 and the gate drive circuit 2 can be reduced.

In addition, as in the second embodiment, since the power supply output voltage of the gate drive circuit power supply E1 is changed during the period in which the semiconductor switching element Q1 is off, it is possible to suppress the influence of the change in the power supply output voltage from affecting the semiconductor switching element Q1. Moreover, the change in the instantaneous value of the load current can be reflected in the change in the power supply output voltage of the gate drive circuit power supply E1 to some extent.

In the third embodiment, when the load current of the semiconductor switching element Q1 is equal to or less than the threshold value TH1, the turn-on gate resistance increases. Therefore, since the switching speed at the time of turn-on is reduced, the surge voltage and the radiation noise can be suppressed. On the other hand, when the load current of the semiconductor switching element Q1 exceeds the threshold value TH1, the turn-on gate resistance decreases. Therefore, since the switching speed at the time of turn-on is increased, the switching loss during the turn-on period can be reduced.

If a configuration for reducing the turn-on speed when the load current increases is realized, a signal obtained by inverting the on-resistance switching signal may be used instead of the on-resistance switching signal. With such a configuration, since the turn-on gate resistance increases, the turn-on speed can be reduced.

Note that the embodiments and the modifications can be freely combined, and the embodiments and the modifications can be appropriately modified or omitted.

The above description is illustrative and not restrictive in all aspects. It is understood that numerous modifications not illustrated can be assumed.

EXPLANATION OF REFERENCE SIGNS

1: PWM controller
3, 4: control unit
DLC: delay circuit
E1: gate drive circuit power supply
E3: power supply
Q1: semiconductor switching element
RG1: first resistor
RG2: second resistor

12

The invention claimed is:

1. A driver device that drives a semiconductor switching element based on on and off of a gate drive signal, the driver device comprising:

a gate drive circuit power supply capable of changing an output voltage;

a power supply having a fixed voltage lower than the output voltage;

a controller that changes the output voltage of the gate drive circuit power supply on a basis of related information related to a load current of the semiconductor switching element; and a delay circuit that, when the gate drive signal is turned on, performs control to supply the fixed voltage to a gate of the semiconductor switching element for a predetermined period, and then performs control to supply the output voltage to the gate.

2. The driver device according to claim 1, wherein the related information is a change pattern of the output voltage determined in advance with respect to an effective value of the load current.

3. The driver device according to claim 1, wherein the related information is the load current sampled when the gate drive signal is turned off.

* * * * *